US012730171B2

(12) United States Patent
Wang et al.

(10) Patent No.: US 12,730,171 B2
(45) Date of Patent: Sep. 8, 2026

(54) SYSTEM AND METHOD FOR DISTORTION AND MOTION ARTIFACT-FREE DIFFUSION IMAGING USING SINGLE-SHOT DIFFUSION-PREPARED TURBO-SPIN-ECHO SEQUENCE WITH SPIRAL-RING READOUTS AND MAGNITUDE STABILIZERS

(71) Applicant: University of Virginia Patent Foundation, Charlottesville, VA (US)

(72) Inventors: Zhixing Wang, Charlottesville, VA (US); John P. Mugler, III, Charlottesville, VA (US); Craig H. Meyer, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 18/402,720

(22) Filed: Jan. 2, 2024

(65) Prior Publication Data

US 2024/0219501 A1 Jul. 4, 2024

Related U.S. Application Data

(60) Provisional application No. 63/436,680, filed on Jan. 2, 2023.

(51) Int. Cl.
*G01R 33/563* (2006.01)
*G01R 33/56* (2006.01)
(Continued)

(52) U.S. Cl.
CPC ... *G01R 33/56341* (2013.01); *G01R 33/5608* (2013.01); *G01R 33/5617* (2013.01); *G01R 33/56509* (2013.01)

(58) Field of Classification Search
USPC ........................................................ 324/309
See application file for complete search history.

(56) References Cited

U.S. PATENT DOCUMENTS 5,245,282 A 9/1993 Mugler, III et al.
6,775,568 B2 8/2004 Mugler, III et al.
(Continued)

FOREIGN PATENT DOCUMENTS

WO 2002050574 A1 6/2002
WO 2002084305 A1 10/2002
(Continued)

OTHER PUBLICATIONS

Wang, Allen, Feng, Mugler III, Meyer, Spring-Rio Tse: 2D T2-Weighted Turbo Spin-Echo brain imaging using SPiral RINGs with retraced in/out trajectories; Magn Reson Med. Apr. 8, 2022; 88:601-616.
(Continued)

*Primary Examiner* — Farhana A Hoque
(74) *Attorney, Agent, or Firm* — Meunier Carlin & Curfman LLC

(57) ABSTRACT

Acquiring magnetic resonance imaging (MRI) data includes steps of using a computer to implement software program steps in a diffusion preparation software component and a spiral ring echo readout software component. The method implements the diffusion preparation software component by (i) applying at least a first diffusion gradient and a last diffusion gradient along a selected direction; and (ii) applying a magnitude stabilizer gradient, along said selected direction, after the last diffusion gradient. The method implements the spiral ring echo readout software component by (i) applying a rephasing gradient along said selected direction after a refocusing RF pulse; (ii) applying a dephasing gradient along said selected direction prior to a subsequent refocusing RF pulse; and (iii) acquiring spiral ring
(Continued)

echo readout data between the refocusing RF pulse and the subsequent refocusing RF pulse.

10 Claims, 6 Drawing Sheets

(51) Int. Cl.
*G01R 33/561* (2006.01)
*G01R 33/565* (2006.01)

(56) References Cited

U.S. PATENT DOCUMENTS

| | | | | |
|---|---|---|---|---|
| 7,034,533 | B2 | 4/2006 | Mugler, III et al. | |
| 7,164,268 | B2 | 1/2007 | Mugler, III et al. | |
| 7,174,200 | B2 | 2/2007 | Salerno et al. | |
| 7,583,082 | B1 | 9/2009 | Hu et al. | |
| 7,642,777 | B1 | 1/2010 | Meyer et al. | |
| 7,705,597 | B2 | 4/2010 | Horger et al. | |
| 7,805,176 | B2 | 9/2010 | Ruppert et al. | |
| 7,888,935 | B1 | 2/2011 | Tan et al. | |
| 8,026,720 | B1 | 9/2011 | Chen et al. | |
| 8,094,907 | B1 | 1/2012 | Meyer et al. | |
| 8,238,634 | B1 | 8/2012 | Meyer et al. | |
| 8,306,289 | B1 | 11/2012 | Meyer et al. | |
| 8,440,167 | B2 | 5/2013 | Beller et al. | |
| RE44,644 | E | 12/2013 | Mugler, III et al. | |
| RE45,725 | E | 10/2015 | Mugler, III et al. | |
| 9,183,626 | B2 | 11/2015 | Zhao et al. | |
| 9,322,896 | B2 | 4/2016 | Fielden et al. | |
| 9,360,545 | B2 | 6/2016 | Mugler, III et al. | |
| 9,589,345 | B2 | 3/2017 | Zhao et al. | |
| 9,651,645 | B2 | 5/2017 | Fielden et al. | |
| 9,811,924 | B2 | 11/2017 | Johnson et al. | |
| 9,874,623 | B2 | 1/2018 | Fielden et al. | |
| 9,891,300 | B2 | 2/2018 | Mugler et al. | |
| 9,910,118 | B2 | 3/2018 | Feng et al. | |
| 9,953,439 | B2 | 4/2018 | Salerno et al. | |
| 9,989,611 | B2 | 6/2018 | Zhao et al. | |
| 10,054,656 | B2 | 8/2018 | Horger et al. | |
| RE47,178 | E | 12/2018 | Mugler, III et al. | |
| 10,143,384 | B2 | 12/2018 | Chen et al. | |
| 10,314,511 | B2 | 6/2019 | Meyer et al. | |
| 10,557,908 | B2 | 2/2020 | Meyer et al. | |
| 10,561,337 | B2 | 2/2020 | Zhao et al. | |
| 10,718,837 | B2 | 7/2020 | Mugler, III et al. | |
| 10,722,137 | B2 | 7/2020 | Fielden et al. | |
| RE48,347 | E | 12/2020 | Mugler, III et al. | |
| 11,024,025 | B2 * | 6/2021 | Meyer | G06V 10/82 |
| 11,085,980 | B2 | 8/2021 | Fielden et al. | |
| 11,204,409 | B2 | 12/2021 | Wang et al. | |
| 11,294,015 | B2 | 4/2022 | Abdishektaei et al. | |
| 11,320,506 | B2 | 5/2022 | Sun et al. | |
| 2007/0197903 | A1 | 8/2007 | Mugler, III et al. | |
| 2010/0280358 | A1 | 11/2010 | Mata et al. | |
| 2015/0282719 | A1 | 10/2015 | Fielden et al. | |
| 2015/0287222 | A1 | 10/2015 | Zhao et al. | |
| 2017/0202478 | A1 | 7/2017 | Handsfield et al. | |
| 2018/0372829 | A1 * | 12/2018 | Huang | G01R 33/56341 |
| 2021/0208225 | A1 | 7/2021 | Gilbo et al. | |
| 2021/0267455 | A1 | 9/2021 | Ghadimi et al. | |
| 2021/0287367 | A1 | 9/2021 | Meyer et al. | |
| 2022/0125314 | A1 | 4/2022 | Meyer et al. | |
| 2022/0188602 | A1 | 6/2022 | Meyer et al. | |
| 2022/0338750 | A1 | 10/2022 | Allen et al. | |
| 2022/0349970 | A1 | 11/2022 | Wang et al. | |
| 2022/0357416 | A1 | 11/2022 | Mugler, III et al. | |
| 2022/0373627 | A1 | 11/2022 | Wang et al. | |
| 2022/0373630 | A1 | 11/2022 | Dou et al. | |
| 2023/0342886 | A1 | 10/2023 | Meyer et al. | |

FOREIGN PATENT DOCUMENTS

| | | | |
|---|---|---|---|
| WO | 2003098390 | A1 | 11/2003 |
| WO | 2005086931 | A1 | 9/2005 |
| WO | 2005086932 | A1 | 9/2005 |
| WO | 2010062557 | A1 | 6/2010 |
| WO | 2012145547 | A1 | 10/2012 |
| WO | 2013023214 | A1 | 2/2013 |
| WO | 2016004423 | A1 | 1/2016 |
| WO | 2020163539 | A1 | 8/2020 |
| WO | 2020219915 | A1 | 10/2020 |
| WO | 2021055889 | A1 | 3/2021 |

OTHER PUBLICATIONS

Wiest-Daessle N, Prima S, Coupe P, Morrissey S P, Barillot C. Rician noise removal by non-Local Means filtering for low signal-to-noise ratio MRI: applications to D T-Mri. Med Image Comput Comput Assist Interv. Feb. 2008; 11 (Pt 2): 171-179.

Charles-Edwards, Elizabeth M. and deSouza, Nandita M., Diffusion-weighted magnetic resonance imaging and its application to cancer; Cancer Imaging (Sep. 13 2006) 6, 135-143 ; DOI: 10.1102/1470-7330.2006.0021.

* cited by examiner

SYSTEM AND METHOD FOR DISTORTION AND MOTION ARTIFACT-FREE DIFFUSION IMAGING USING SINGLE-SHOT DIFFUSION-PREPARED TURBO-SPIN-ECHO SEQUENCE WITH SPIRAL-RING READOUTS AND MAGNITUDE STABILIZERS

CROSS-REFERENCE TO RELATED APPLICATION

This application claims priority to and benefit under 35 U.S.C § 119(e) of U.S. Provisional Patent Application Ser. No. 63/436,680 filed on Jan. 2, 2023, which is incorporated by reference as if set forth fully herein.

STATEMENT REGARDING FEDERALLY FUNDED RESEARCH

This invention was made with government support under NIH Grant No. EB028773 awarded by National Institutes of Health. The government has certain rights in the invention.

FIELD

The present disclosure relates to magnetic resonance imaging (MRI) operations that, according to some aspects, reconstructs MRI images from spirally acquired MRI data and provides final images having suppressed artifact images across numerous imaging domains.

BACKGROUND

The present disclosure generally relates to the field of medical imaging for analysis of certain physiological activities of a subject. For example, and without limiting this disclosure, various conventional imaging techniques can provide for an assessment of a body of a subject with regard to spatial coverage. Two-dimensional (2D), three-dimensional (3D), and "cine" data measurements can provide a complete assessment of a subject, such as a human patient, with regard to spatial coverage and a comprehensive evaluation of certain areas.

This disclosure addresses a need in the art of MRI data acquisition left by conventional Cartesian sampling that remains time consuming because of its relatively inefficient k-space coverage when prescribing high-isotropic spatial resolution. This problem becomes worse at low-field systems compared to the mid- or high-field systems, due to the inherently lower signal to noise ratio, which requires several signal averages to maintain clinically acceptable image quality and thus increases the total scan time by at least double.

SUMMARY

Other aspects and features according to the example embodiments of the disclosed technology will become apparent to those of ordinary skill in the art, upon reviewing the following detailed description in conjunction with the accompanying figures.

In one embodiment, a computer implemented method of acquiring magnetic resonance imaging (MRI) data includes steps of using a computer including a processor and computer memory to implement software program steps in a diffusion preparation software component and a spiral ring echo readout software component. The method implements the diffusion preparation software component by (i) applying at least a first diffusion gradient and a last diffusion gradient along a selected direction; and (ii) applying a magnitude stabilizer gradient, along said selected direction, after the last diffusion gradient. The method implements the spiral ring echo readout software component by (i) applying a rephasing gradient along said selected direction after a refocusing RF pulse; (ii) applying a dephasing gradient along said selected direction prior to a subsequent refocusing RF pulse; and (iii) acquiring spiral ring echo readout data between the refocusing RF pulse and the subsequent refocusing RF pulse.

A computer implemented system includes a computer having hardware and software to perform the computer implemented method.

BRIEF DESCRIPTION OF THE DRAWINGS

Reference will now be made to the accompanying drawings, which are not necessarily drawn to scale.

FIG. 3M FIG. 3E illustrates an example of a single shot in vivo result having mean apparent diffusion coefficient (ADC) maps for three main directions acquired through SS-DW-EPI.

DETAILED DESCRIPTION

Figure 1:
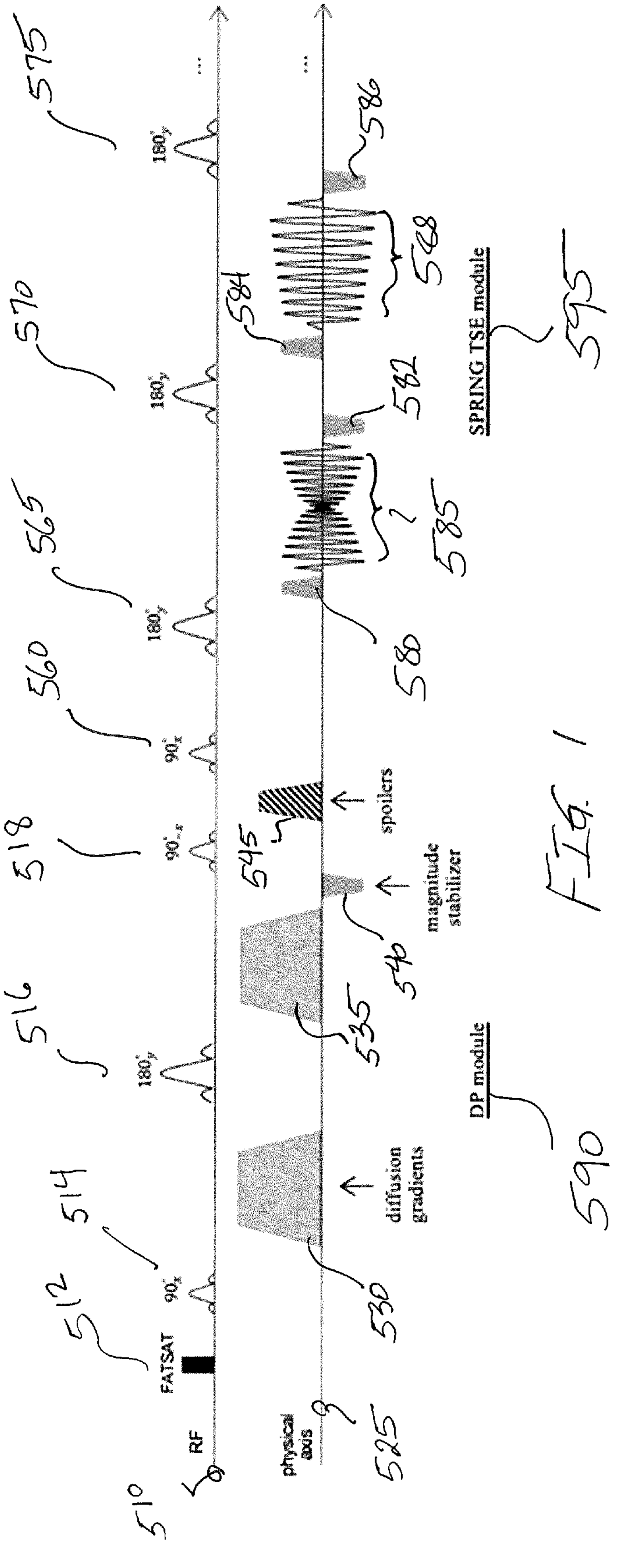
FIG. 1 illustrates a sequence diagram of single-shot diffusion-prepared (DP) spiral-ring (SPRING) TSE with gradient stabilizers including diffusion gradients, magnitude stabilizers, and spoiler gradients.

Although example embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

As discussed herein, a "subject" (or "patient") may be any applicable human, animal, or other organism, living or dead, or other biological or molecular structure or chemical environment, and may relate to particular components of the subject, for instance specific organs, tissues, or fluids of a subject, may be in a particular location of the subject, referred to herein as an "area of interest" or a "region of interest."

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n]" corresponds to the nth reference in the list. All references cited and discussed in this specification are incorporated herein by reference in their entireties and to the same extent as if each reference was individually incorporated by reference.

In the following description, references are made to the accompanying drawings that form a part hereof and that show, by way of illustration, specific embodiments or examples. In referring to the drawings, like numerals represent like elements throughout the several figures.

FIG. 7 is a system diagram illustrating an operating environment capable of implementing aspects of the present disclosure in accordance with one or more example embodiments. FIG. 7 illustrates an example of a magnetic resonance imaging (MRI) system 100, including a data acquisition and display computer 150 coupled to an operator console 110, an MRI real-time control sequencer 152, and an MRI subsystem 154. The MRI subsystem 154 may include XYZ magnetic gradient coils and associated amplifiers 168, a static Z-axis magnet 169, a digital RF transmitter 162, a digital RF receiver 160, a transmit/receive switch 164, and RF coil(s) 166. The MRI subsystem 154 may be controlled in real time by control sequencer 152 to generate magnetic and radio frequency fields that stimulate magnetic resonance phenomena in a living subject, patient P, to be imaged. A contrast-enhanced image of an area of interest A of the patient P may be shown on display 158. The display 158 may be implemented through a variety of output interfaces, including a monitor, printer, or data storage.

The area of interest "A" corresponds to a region associated with one or more physiological activities in patient "P". The area of interest shown in the example embodiment of FIG. 1 corresponds to a chest region of patient "P", but the area of interest for purposes of implementing aspects of the disclosure presented herein is not limited to the chest area. It should be recognized and appreciated that the area of interest can be one or more of a brain region, heart region, and upper or lower limb regions of the patient "P", for example.

It should be appreciated that any number and type of computer-based medical imaging systems or components, including various types of commercially available medical imaging systems and components, may be used to practice certain aspects of the present disclosure. Systems as described herein with respect to example embodiments are not intended to be specifically limited to magnetic resonance imaging (MRI) implementations or the particular system shown in FIG. 7.

One or more data acquisition or data collection steps as described herein in accordance with one or more embodiments may include acquiring, collecting, receiving, or otherwise obtaining data such as imaging data corresponding to an area of interest. By way of example, data acquisition or collection may include acquiring data via a data acquisition device, receiving data from an on-site or off-site data acquisition device or from another data collection, storage, or processing device. Similarly, data acquisition or data collection devices of a system in accordance with one or more embodiments of the present disclosure may include any device configured to acquire, collect, or otherwise obtain data, or to receive data from a data acquisition device within the system, an independent data acquisition device located on-site or off-site, or another data collection, storage, or processing device.

FIG. 8 is a computer architecture diagram showing a general computing system capable of implementing aspects of the present disclosure in accordance with one or more embodiments described herein. A computer 200 may be configured to perform one or more functions associated with embodiments of this disclosure. For example, the computer 200 may be configured to perform operations of the method as described below. It should be appreciated that the computer 200 may be implemented within a single computing device or a computing system formed with multiple connected computing devices. The computer 200 may be configured to perform various distributed computing tasks, which may distribute processing and/or storage resources among the multiple devices. The data acquisition and display computer 150 and/or operator console 110 of the system shown in FIG. 1 may include one or more systems and components of the computer 200.

As shown, the computer 200 includes a processing unit 202 ("CPU"), a system memory 204, and a system bus 206 that couples the memory 204 to the CPU 202. The computer 200 further includes a mass storage device 212 for storing program modules 214. The program modules 214 may be operable to perform one or more functions associated with embodiments of method as illustrated in one or more of the figures of this disclosure, for example to cause the computer 200 to perform operations of the automated DENSE analysis as described below. The program modules 214 may include an imaging application 218 for performing data acquisition functions as described herein, for example to receive image data corresponding to magnetic resonance imaging of an area of interest. The computer 200 can include a data store 220 for storing data that may include imaging-related data 222 such as acquired image data, and a modeling data store 224 for storing image modeling data, or other various types of data utilized in practicing aspects of the present disclosure.

The mass storage device 212 is connected to the CPU 202 through a mass storage controller (not shown) connected to the bus 206. The mass storage device 212 and its associated computer-storage media provide non-volatile storage for the computer 200. Although the description of computer-storage media contained herein refers to a mass storage device, such as a hard disk or CD-ROM drive, it should be appreciated by those skilled in the art that computer-storage media can be any available computer storage media that can be accessed by the computer 200.

By way of example, and not limitation, computer-storage media (also referred to herein as a "computer-readable storage medium" or "computer-readable storage media") may include volatile and non-volatile, removable and non-removable media implemented in any method or technology for storage of information such as computer-storage instructions, data structures, program modules, or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer 200. Transitory signals are not "computer-storage media", "computer-readable storage medium" or "computer-readable storage media" as described herein.

According to various embodiments, the computer 200 may operate in a networked environment using connections to other local or remote computers through a network 216 via a network interface unit 210 connected to the bus 206. The network interface unit 210 may facilitate connection of the computing device inputs and outputs to one or more suitable networks and/or connections such as a local area network (LAN), a wide area network (WAN), the Internet, a cellular network, a radio frequency network, a Bluetooth-enabled network, a Wi-Fi enabled network, a satellite-based network, or other wired and/or wireless networks for communication with external devices and/or systems. The computer 200 may also include an input/output controller 208 for receiving and processing input from a number of input devices. Input devices may include one or more of keyboards, mice, stylus, touchscreens, microphones, audio capturing devices, or image/video capturing devices. An end user may utilize such input devices to interact with a user interface, for example a graphical user interface, for managing various functions performed by the computer 200.

The bus 206 may enable the processing unit 202 to read code and/or data to/from the mass storage device 212 or other computer-storage media. The computer-storage media may represent apparatus in the form of storage elements that are implemented using any suitable technology, including but not limited to semiconductors, magnetic materials, optics, or the like. The computer-storage media may represent memory components, whether characterized as RAM, ROM, flash, or other types of technology. The computer-storage media may also represent secondary storage, whether implemented as hard drives or otherwise. Hard drive implementations may be characterized as solid state or may include rotating media storing magnetically-encoded information. The program modules 214, which include the imaging application 218, may include instructions that, when loaded into the processing unit 202 and executed, cause the computer 200 to provide functions associated with embodiments illustrated herein. The program modules 214 may also provide various tools or techniques by which the computer 200 may participate within the overall systems or operating environments using the components, flows, and data structures discussed throughout this description.

In general, the program modules 214 may, when loaded into the processing unit 202 and executed, transform the processing unit 202 and the overall computer 200 from a general-purpose computing system into a special-purpose computing system. The processing unit 202 may be constructed from any number of transistors or other discrete circuit elements, which may individually or collectively assume any number of states. More specifically, the processing unit 202 may operate as a finite-state machine, in response to executable instructions contained within the program modules 214. These computer-executable instructions may transform the processing unit 202 by specifying how the processing unit 202 transitions between states, thereby transforming the transistors or other discrete hardware elements constituting the processing unit 202.

Encoding the program modules 214 may also transform the physical structure of the computer-storage media. The specific transformation of physical structure may depend on various factors, in different implementations of this description. Examples of such factors may include but are not limited to the technology used to implement the computer-storage media, whether the computer storage media are characterized as primary or secondary storage, and the like. For example, if the computer-storage media are implemented as semiconductor-based memory, the program modules 214 may transform the physical state of the semiconductor memory, when the software is encoded therein. For example, the program modules 214 may transform the state of transistors, capacitors, or other discrete circuit elements constituting the semiconductor memory.

As another example, the computer-storage media may be implemented using magnetic or optical technology. In such implementations, the program modules 214 may transform the physical state of magnetic or optical media, when the software is encoded therein. These transformations may include altering the magnetic characteristics of particular locations within given magnetic media. These transformations may also include altering the physical features or characteristics of particular locations within given optical media, to change the optical characteristics of those locations. Other transformations of physical media are possible without departing from the scope of the present description, with the foregoing examples provided only to facilitate this discussion.

The computing system can include clients and servers. A client and server are generally remote from each other and generally interact through a communication network. The relationship of client and server arises by virtue of computer programs running on the respective computers and having a client-server relationship to each other. In embodiments deploying a programmable computing system, it will be appreciated that both hardware and software architectures require consideration. Specifically, it will be appreciated that the choice of whether to implement certain functionality in permanently configured hardware (e.g., an ASIC), in temporarily configured hardware (e.g., a combination of software and a programmable processor), or a combination of permanently and temporarily configured hardware can be a design choice. Below are set out hardware (e.g., machine 300) and software architectures that can be deployed in example embodiments.

The machine 300 of FIG. 9 can operate as a standalone device or the machine 300 can be connected (e.g., networked) to other machines. In a networked deployment, the machine 300 can operate in the capacity of either a server or a client machine in server-client network environments. In an example, machine 300 can act as a peer machine in peer-to-peer (or other distributed) network environments. The machine 300 can be a personal computer (PC), a tablet PC, a set-top box (STB), a Personal Digital Assistant (PDA), a mobile telephone, a web appliance, a network router, switch or bridge, or any machine capable of executing instructions (sequential or otherwise) specifying actions to be taken (e.g., performed) by the machine 300. Further, while only a single machine 300 is illustrated, the term "machine" shall also be taken to include any collection of machines that individually or jointly execute a set (or multiple sets) of instructions to perform any one or more of the methodologies discussed herein.

Example machine (e.g., computer system) 300 can include a processor 302 (e.g., a central processing unit (CPU), a graphics processing unit (GPU) or both), a main memory 304 and a static memory 306, some or all of which can communicate with each other via a bus 308. The machine 300 can further include a display unit 310, an alphanumeric input device 312 (e.g., a keyboard), and a user interface (UI) navigation device 311 (e.g., a mouse). In an example, the display unit 810, input device 317 and UI navigation device 314 can be a touch screen display. The machine 300 can additionally include a storage device (e.g., drive unit) 316, a signal generation device 318 (e.g., a speaker), a network interface device 320, and one or more sensors 321, such as a global positioning system (GPS) sensor, compass, accelerometer, or other sensor. The storage device 316 can include a machine readable medium 322 on which is stored one or more sets of data structures or instructions 324 (e.g., software) embodying or utilized by any one or more of the methodologies or functions described herein. The instructions 324 can also reside, completely or at least partially, within the main memory 304, within static memory 306, or within the processor 302 during execution thereof by the machine 300. In an example, one or any combination of the processor 302, the main memory 304, the static memory 306, or the storage device 316 can constitute machine readable media. While the machine readable medium 322 is illustrated as a single medium, the term "machine readable medium" can include a single medium or multiple media (e.g., a centralized or distributed database, and/or associated caches and servers) that configured to store the one or more instructions 324. The term "machine readable medium" can also be taken to include any tangible medium that is capable of storing, encoding, or carrying instructions for execution by the machine and that cause the machine to perform any one or more of the methodologies of the present disclosure or that is capable of storing, encoding or carrying data structures utilized by or associated with such instructions. The term "machine readable medium" can accordingly be taken to include, but not be limited to, solid-state memories, and optical and magnetic media.

Specific examples of machine readable media can include non-volatile memory, including, by way of example, semiconductor memory devices (e.g., Electrically Programmable Read-Only Memory (EPROM), Electrically Erasable Programmable Read-Only Memory (EEPROM)) and flash memory devices; magnetic disks such as internal hard disks and removable disks; magnetooptical disks; and CD-ROM and DVD-ROM disks. The instructions 324 can further be transmitted or received over a communications network 326 using a transmission medium via the network interface device 320 utilizing any one of a number of transfer protocols (e.g., frame relay, IP, TCP, UDP, HTTP, etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., IEEE 802.11 standards family known as Wi-Fi®, IEEE 802.16 standards family known as WiMax®), peer-to-peer (P2P) networks, among others. The term "transmission medium" shall be taken to include any intangible medium that is capable of storing, encoding or carrying instructions for execution by the machine, and includes digital or analog communications signals or other intangible medium to facilitate communication of such software.

For purposes of this disclosure, the following technical definitions will apply, without limiting the disclosure:

A "voxel" is the fundamental unit of space within a 3D Cartesian grid (analogous to a "pixel" in a 2D grid).

The term "isotropic" means that the voxels are a cube of uniform dimensions, say 0.1 mm×0.1 mm×0.1 mm, allowing the images to be reformatted in any viewer-direction with equal resolution.

"T1-weighted" and "T2-weighted" refer to the type of magnetic degeneration following an MRI pulse: T1 is the primary relaxation of the nucleus from the pulse direction to the main longitudinal field, while T2 refers to decay of the transverse component of net magnetization (also known as spin-spin relaxation).

"PD-weighted" refers to the weighting based on proton density.

A "FLAIR" image ("Fluid Attenuated Inversion Recovery") is a sequence similar to a T2-weighted image, except that the Time to Repetition ("TR", the time between successive pulses applied to the same slice) and Time to Echo ("TE", time between delivery of the pulse and receipt of the echo signal) are very long by comparison.

SPACE, an acronym for "Sampling Perfection with Application optimized Contrasts using different flip angle Evolution," is the name for the TSE version offered specifically by Siemens Medical, which has special modifications optimizing. Some other platforms are called as follows:

CUBE® is the GE brand name of their sequence (not an acronym);

VISTA® is the Philips name, an abbreviation for "Volume Isotropic Turbo spin echo Acquisition";

Hitachi's brand name is isoFSE®;

Canon calls their platform 3D MVOX® (for "Multi-VOXel").

SPRING is an acronym for "spiral ring encoding."

SS stands for "single shot."

DP stands for "diffusion prepared" in accordance with this disclosure.

DW stands for "diffusion weighted" in accordance with other methods discussed herein.

TSE stands for "turbo-spin-echo."

This disclosure can be applied in a platform-independent manner wherever TSEs share the following common elements:

Very long echo train lengths, typically 100-250 echoes;

Ultrashort echo spacing, typically 3-4 msec;

Non-selective refocusing pulses.

This study provides an alternative approach to conventional diffusion-weighted (DW) echo planar imaging (EPI-based) sequences. A two dimensional (2D) single-shot (SS) diffusion-prepared (DP) turbo-spin-echo (TSE) sequence, combined with spiral-ring trajectories and magnitude stabilizers, dubbed "SS-DP-SPRING TSE", was developed for distortion and motion artifact-free diffusion imaging. Compared to a SS-DW-EPI sequence, this method is less sensitive to Bo-inhomogeneity and thus provides diffusion weighted-images with improved geometric fidelity. It is important to note that one goal of diffusion weighting is to be able to identify differences of molecular diffusion (e.g., water diffusion) through parts of an anatomy under study with MRI.

A schematic of the proposed SS-DP-SPRING TSE sequence is depicted in FIG. 1. The diffusion-prepared (DP) module 500 consisted of Stejskal-Tanner monopolar diffusion gradients 530, 535 and one magnitude stabilizer 540 (approximately 4 pi dephasing) along the slice-select direction (transverse to a k-space encoding orientation that includes two other directions or axes), followed by a 90 tip-up RF pulse 518 that flips the diffusion-encoded signal back to a respective longitudinal axis. Large spoiler gradients 545 (about 2× larger than stabilizers) were added immediately after the diffusion-prepared module 590 and before the following TSE acquisition 595. Rephasing gradients 580, 584 and dephasing gradients 582, 586 were inserted before and after each echo 585, 588 during the spiral-ring readout to form the echo and distribute the magnetization, respectively. The added stabilizers offered the benefit of converting the magnitude-modulated signal loss into a phase-modulated problem, at the cost of 50% SNR loss as shown at 588. This disclosure further adopted a single-shot acquisition approach, so there is no need of additional phase correction which may not completely resolve phase inconsistencies among shots.

In one non-limiting example, the central spiral-in-out ring was placed at the first echo of the TSE acquisition to obtain a short TE (approx. 11 ms). Ten spiral-rings with linearly decreasing sampling density, from 1 to 0.2, were designed for 1.25 $mm^2$ isotropic in-plane resolution, with a total acquisition time of 110 ms. The duration of diffusion gradients was 12 ms with 71 mT/m amplitude for an estimated b-value of 750 $s/mm^2$, yielding a total duration of 35 ms for the DP module. The slice-thickness of the sinc RF pulses 514, 518 used in the DP module 590 was 1.5× larger than that of the TSE acquisition to mitigate flow-related and cross-talk artifacts. To demonstrate the efficiency of magnitude stabilizers 540, 580, 582, 584, 586 combined with the single-shot theme, this disclosure tested SS-DP-SPRING TSE without stabilizers and with stabilizers, and compared it to 2-shot DP-SPRING TSE with stabilizers. For image reconstruction, NUFFT and L1-ESPIRIT were performed on the undersampled datasets. Experiments were performed on a 3T scanner (MAGNETOM Prisma, Siemens Healthcare, Erlangen, Germany) with a 64-channel head coil array. For healthy volunteer (written informed consent) studies, multiple slices with 4 mm thickness and 2 mm gap were acquired using the proposed methods and SS-DW-EPI.

Figure 2A:
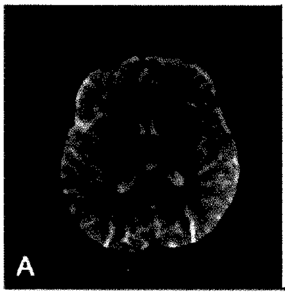
FIG. 2A illustrates in vivo brain images showing a stability of image quality from a single shot DP-SPRING TSE sequence with magnitude stabilizers.
Figure 2B:
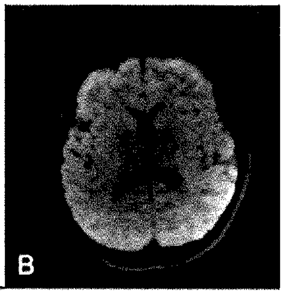
FIG. 2B illustrates in vivo brain images showing a stability of image quality from a single shot DP-SPRING TSE sequence with magnitude stabilizers.
Figure 2C:
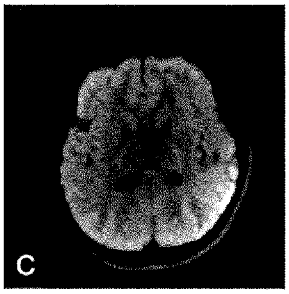
FIG. 2C illustrates in vivo brain images showing a stability of image quality from a single shot DP-SPRING TSE sequence with magnitude stabilizers.
Figure 2D:
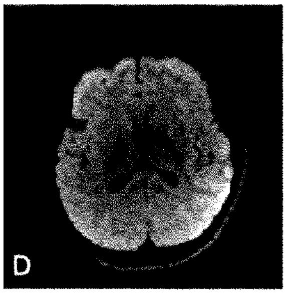
FIG. 2D illustrates in vivo brain images showing a stability of image quality from a single shot DP-SPRING TSE sequence with magnitude stabilizers.
Figure 2E:
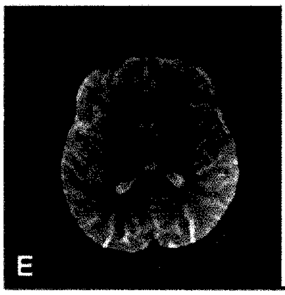
FIG. 2E illustrates in vivo brain images showing a stability of image quality from a single shot DP-SPRING TSE sequence without magnitude stabilizers.
Figure 2F:
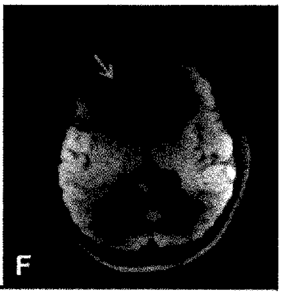
FIG. 2F illustrates in vivo brain images showing a stability of image quality from a single shot DP-SPRING TSE sequence without magnitude stabilizers.
Figure 2G:
FIG. 2G illustrates in vivo brain images showing a stability of image quality from a single shot DP-SPRING TSE sequence without magnitude stabilizers.
Figure 2H:
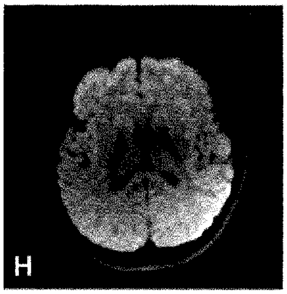
FIG. 2H illustrates in vivo brain images showing a stability of image quality from a single shot DP-SPRING TSE sequence without magnitude stabilizers.
Figure 2I:
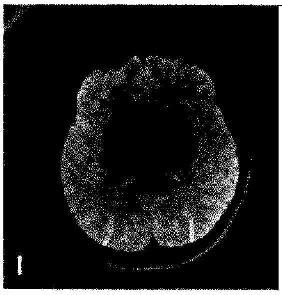
FIG. 2I illustrates in vivo brain images showing a stability of image quality from a two shot DP-SPRING TSE sequence with magnitude stabilizers.
Figure 2J:
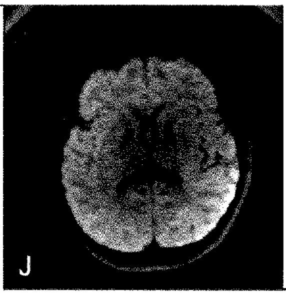
FIG. 2J illustrates in vivo brain images showing a stability of image quality from a two shot DP-SPRING TSE sequence with magnitude stabilizers.
Figure 2K:
FIG. 2K illustrates in vivo brain images showing a stability of image quality from a two shot DP-SPRING TSE sequence with magnitude stabilizers.
Figure 2L:
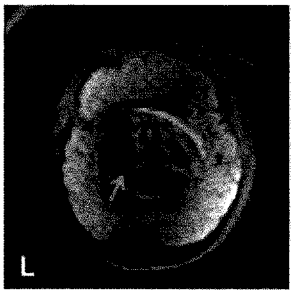
FIG. 2L illustrates in vivo brain images showing a stability of image quality from a two shot DP-SPRING TSE sequence with magnitude stabilizers.
Figure 3Q:
FIG. 3Q is a reference image of the anatomy under study.
Figure 3A:
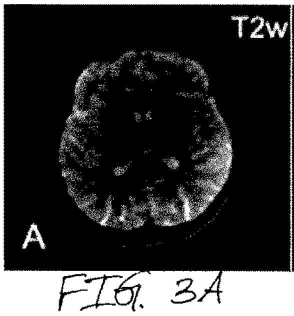
FIG. 3A illustrates an example of a single shot in vivo result having images at b-values of 0 s/mm$^2$ acquired from SS-DP-SPRING TSE with magnitude stabilizers.
Figure 3B:
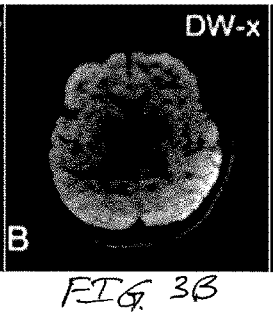
FIG. 3B illustrates an example of a single shot in vivo result having images at b-values of 750 s/mm$^2$ acquired from SS-DP-SPRING TSE with magnitude stabilizers.
Figure 3C:
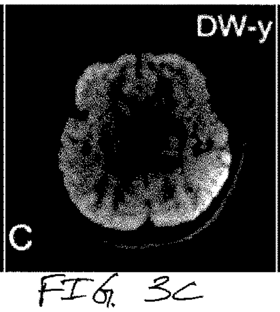
FIG. 3C illustrates an example of a single shot in vivo result having images at b-values of 750 s/mm$^2$ acquired from SS-DP-SPRING TSE with magnitude stabilizers.
Figure 3D:
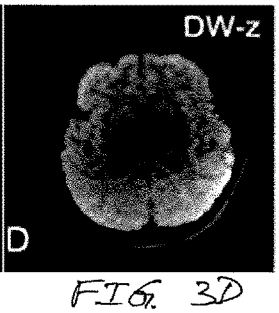
FIG. 3D illustrates an example of a single shot in vivo result having images at b-values of 750 s/mm$^2$ acquired from SS-DP-SPRING TSE with magnitude stabilizers.
Figure 3E:
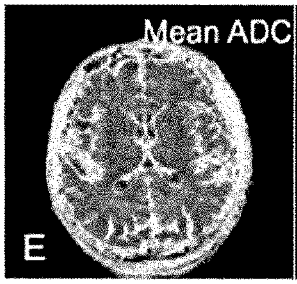
FIG. 3E illustrates an example of a single shot in vivo result having mean apparent diffusion coefficient (ADC) maps for three main directions acquired from SS-DP-SPRING TSE with magnitude stabilizers.
Figure 3F:
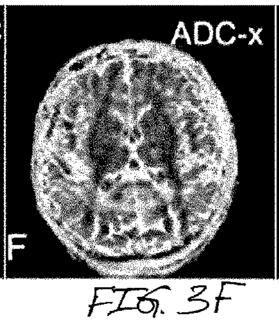
FIG. 3F illustrates an example of a single shot in vivo result having apparent diffusion coefficient (ADC) maps for three main directions acquired from SS-DP-SPRING TSE with magnitude stabilizers.
Figure 3G:
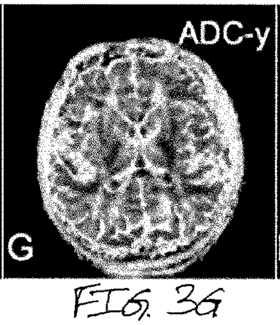
FIG. 3G illustrates an example of a single shot in vivo result having apparent diffusion coefficient (ADC) maps for three main directions acquired from SS-DP-SPRING TSE with magnitude stabilizers.
Figure 3H:
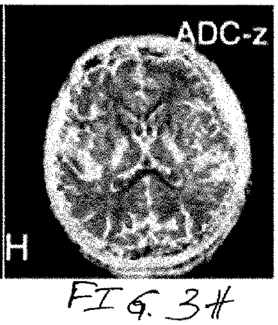
FIG. 3H illustrates an example of a single shot in vivo result having apparent diffusion coefficient (ADC) maps for three main directions acquired from SS-DP-SPRING TSE with magnitude stabilizers.
Figure 3I:
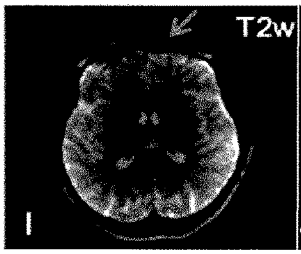
FIG. 3I illustrates an example of a single shot in vivo result having images at b-values of 0 s/mm$^2$ acquired through SS-DW-EPI.
Figure 3J:
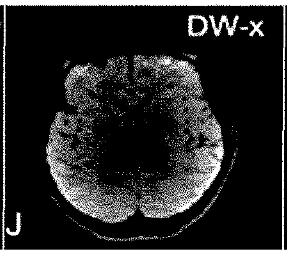
FIG. 3J illustrates an example of a single shot in vivo result having images at b-values of 750 s/mm$^2$ acquired through SS-DW-EPI.
Figure 3K:
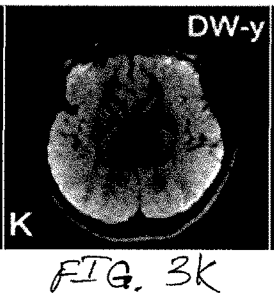
FIG. 3K illustrates an example of a single shot in vivo result having images at b-values of 750 s/mm$^2$ acquired through SS-DW-EPI.
Figure 3L:
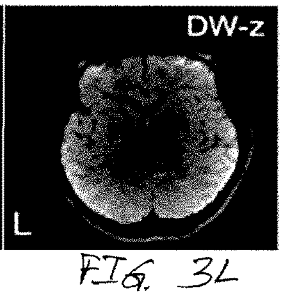
FIG. 3L illustrates an example of a single shot in vivo result having images at b-values of 750 s/mm$^2$ acquired through SS-DW-EPI.
Figure 3M:
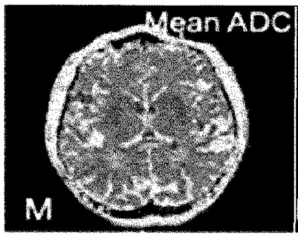
Figure 3N:
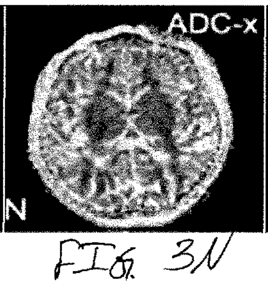
FIG. 3N illustrates an example of a single shot in vivo result having apparent diffusion coefficient (ADC) maps for three main directions acquired through SS-DW-EPI.
Figure 3O:
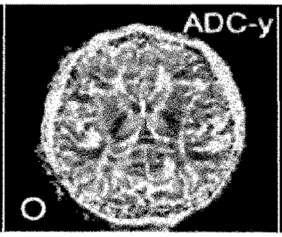
FIG. 3O illustrates an example of a single shot in vivo result having apparent diffusion coefficient (ADC) maps for three main directions acquired through SS-DW-EPI.
Figure 3P:
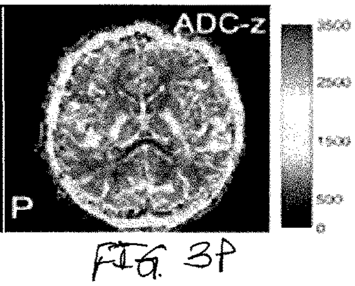
FIG. 3P illustrates an example of a single shot in vivo result having apparent diffusion coefficient (ADC) maps for three main directions acquired through SS-DW-EPI.
Figure 4:
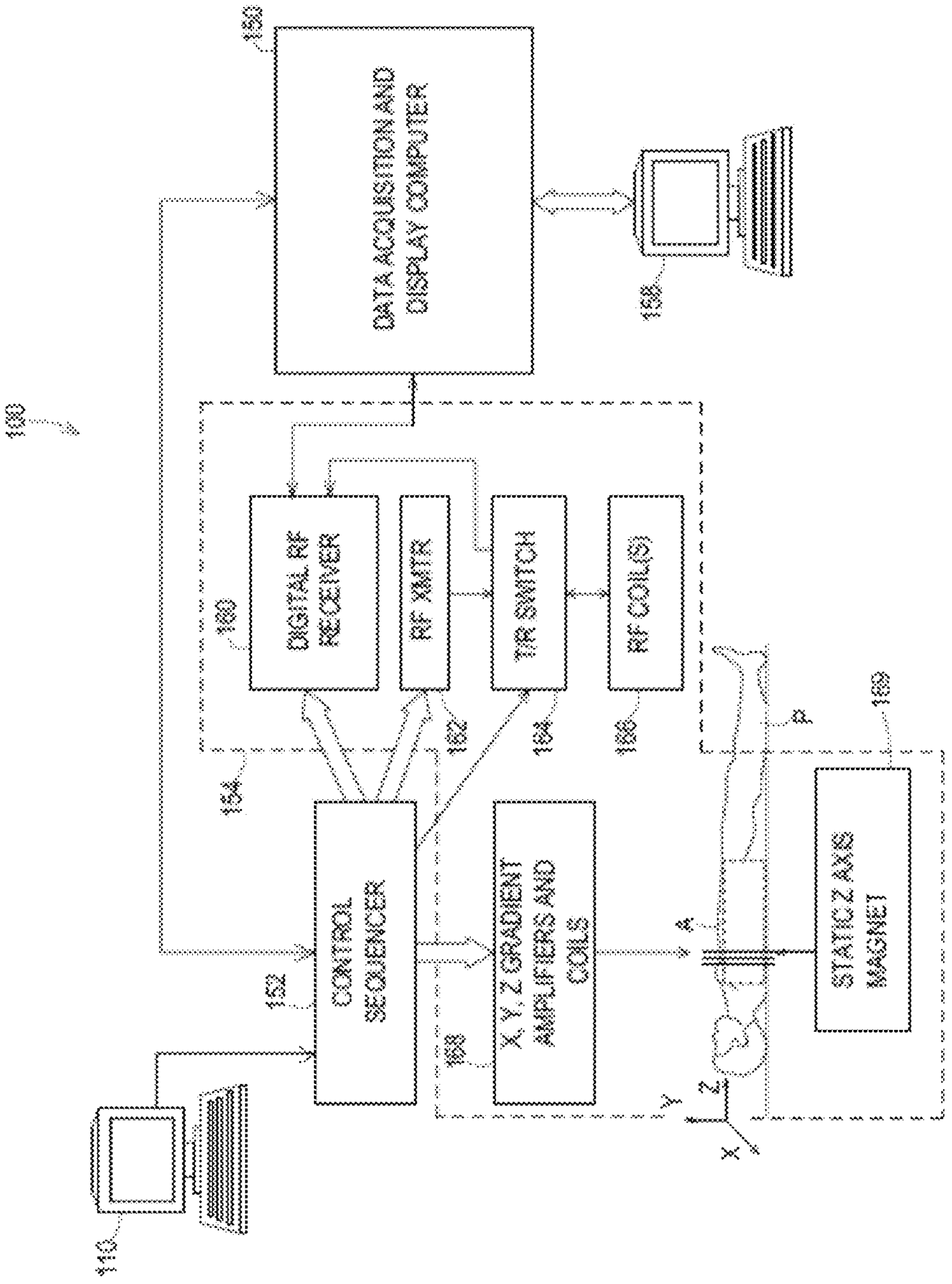
FIG. 4 is a schematic of a computer environment used in accordance with the disclosure herein.
Figure 5:
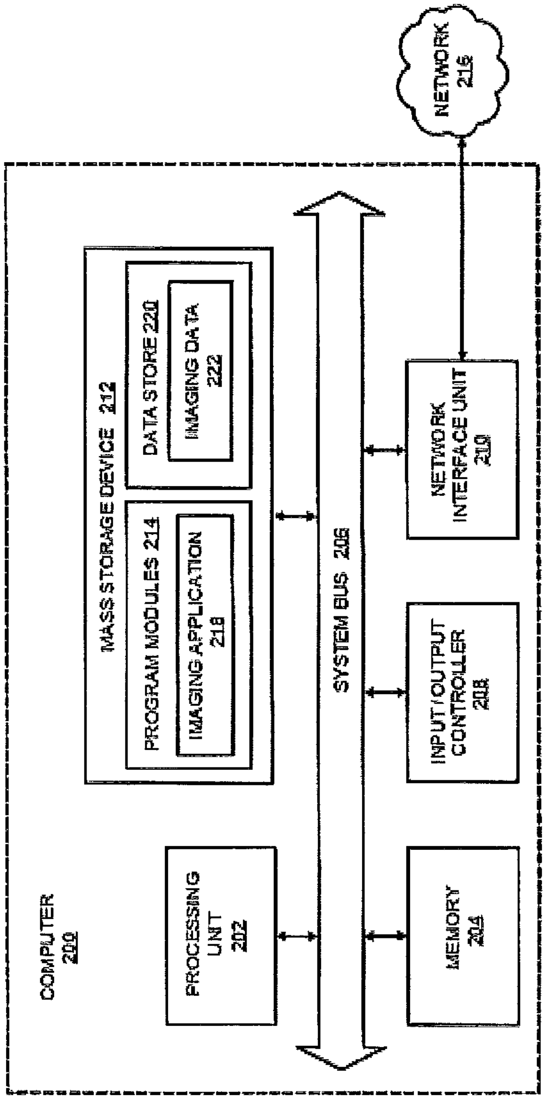
FIG. 5 is a schematic of a computer environment used in accordance with the disclosure herein.
Figure 6:
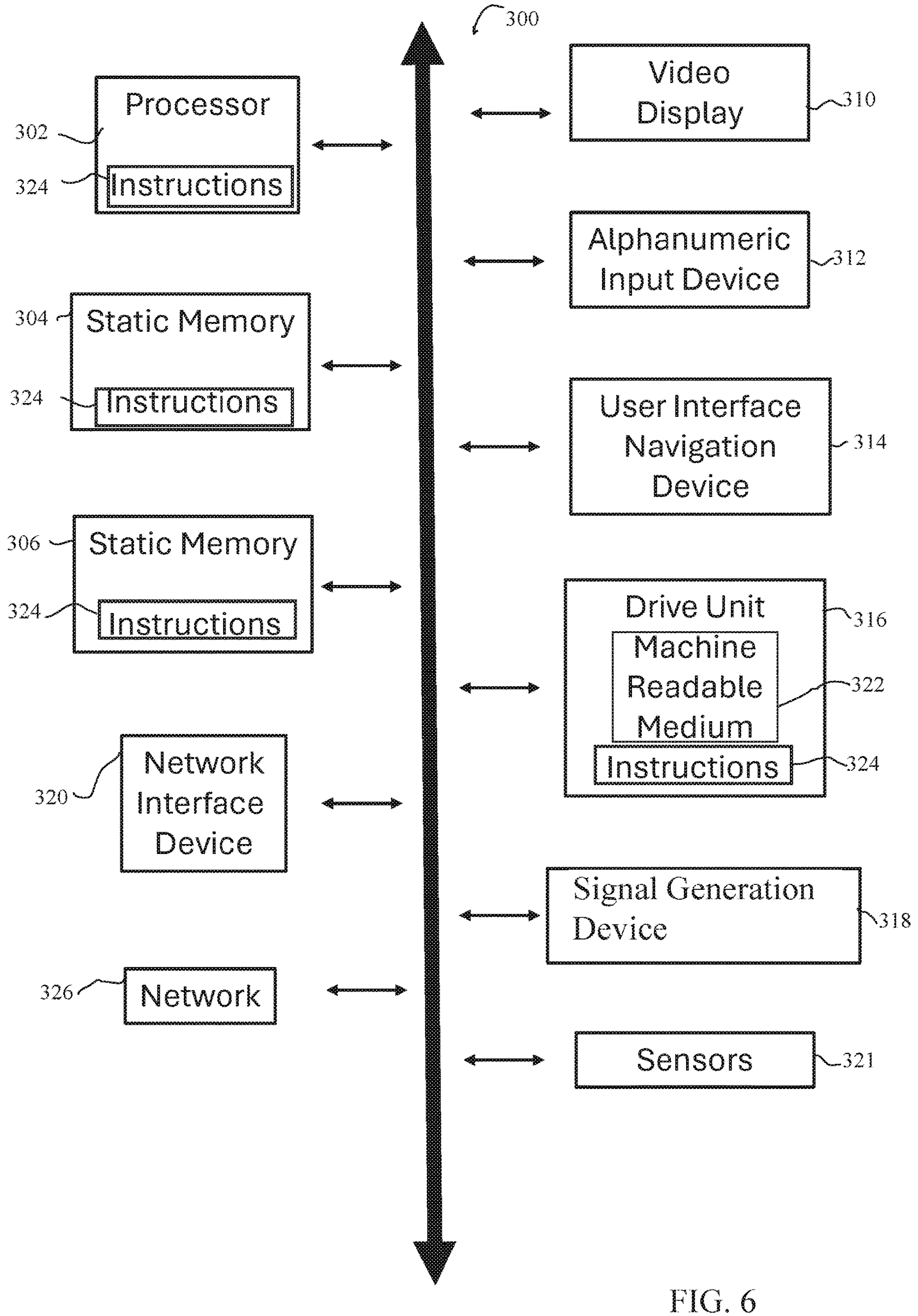
FIG. 6 is a schematic of a computer environment used in accordance with the disclosure herein.

Results and Discussion: FIG. 2 demonstrates the performance improvement for the proposed SS-DP-SPRING TSE with magnitude stabilizers (top) compared to that without stabilizers (middle) and for 2-shot DP-SPRING TSE with stabilizers (bottom). All images were reconstructed using a non-uniform Fast Fourier Transform (NUFFT). Unpredictable severe bands of signal loss can be seen in FIG. 2F-G from SS-DP-SPRING TSE without stabilizers when the diffusion gradient is on. When using 2-shot acquisition, artifacts and signal cancellation are obvious as shown in FIG. 2L, because of cardiac pulsation, when the diffusion gradient is along head-foot direction. Image degradation attributed to magnitude or phase modulation is substantially reduced when applying magnitude stabilizers along with the single-shot theme. FIG. 3 shows examples of estimated ADC maps along three main diffusion directions and the mean ADC values, acquired by SS-DP-SPRING TSE with magnitude stabilizers and L1-ESPIRIT reconstruction (top) and SS-DW-EPI (bottom). A T2-weighted Cartesian TSE image is used for anatomical reference. The proposed method shows similar ADC maps compared to the SS-DW-EPI counterpart, while distortion and signal pile-up artifacts are clearly seen in EPI images (e.g., red arrow). However, some slices from SS-DP-SPRING TSE show residual image artifacts (not shown here), likely due to the system imperfections such as the slice profile of the slice-select tip-up/down and the refocusing RF pulses used in the DP module; future work is warranted to investigate this issue.

In one embodiment, a computer implemented method of acquiring magnetic resonance imaging (MRI) data includes steps of using a computer including a processor and computer memory to implement software program steps in a diffusion preparation software component and a spiral ring echo readout software component. The method implements the diffusion preparation software component by (i) applying at least a first diffusion gradient and a last diffusion gradient along a selected direction; and (ii) applying a magnitude stabilizer gradient, along said selected direction, after the last diffusion gradient. The method implements the spiral ring echo readout software component by (i) applying a rephasing gradient along said selected direction after a refocusing RF pulse; (ii) applying a dephasing gradient along said selected direction prior to a subsequent refocusing RF pulse; and (iii) acquiring spiral ring echo readout data between the refocusing RF pulse and the subsequent refocusing RF pulse.

A computer implemented system includes a computer having hardware and software to perform the computer implemented method.

The computer implemented method may further include sequentially applying the rephasing gradient after successive refocusing RF pulses and sequentially applying the dephasing gradient prior to successive refocusing RF pulses in the pulse sequence; and acquiring additional spiral ring echo readout data between the rephasing gradients and the dephasing gradients.

The computer implemented may further comprise applying a 90 degree tip-up RF pulse after applying the magnitude stabilizer gradient, wherein the 90 degree tip-up RF pulse flips a diffusion-encoded signal back to a respective longitudinal axis.

The computer implemented method of claim 1 may further apply spoiler gradients to a diffusion encoded signal, along said selected direction, after implementing the diffusion preparation software component. The computer implemented method may further include computing apparent diffusion coefficient (ADC) maps from the acquired data.

The specific configurations, choice of materials and the size and shape of various elements can be varied according to particular design specifications or constraints requiring a system or method constructed according to the principles of the disclosed technology. Such changes are intended to be embraced within the scope of the disclosed technology. The presently disclosed embodiments, therefore, are considered in all respects to be illustrative and not restrictive. The patentable scope of certain embodiments of the disclosed technology is indicated by the appended claims, rather than the foregoing description.

The invention claimed is:

1. A computer implemented method of acquiring magnetic resonance imaging (MRI) data, the method comprising:

using a computer including a processor and computer memory to implement software program steps in a diffusion preparation software component and a spiral ring echo readout software component;

implementing the diffusion preparation software component by:

applying at least a first diffusion gradient and a last diffusion gradient along a selected direction; and applying a magnitude stabilizer gradient, along said selected direction, after the last diffusion gradient;

implementing the spiral ring echo readout software component by:

applying a rephasing gradient along said selected direction after a refocusing RF pulse;

applying a dephasing gradient along said selected direction prior to a subsequent refocusing RF pulse; and acquiring spiral ring echo readout data between the refocusing RF pulse and the subsequent refocusing RF pulse;

storing the spiral ring echo readout data in k-space encoding:

computing apparent diffusion coefficient (ADC) maps from the k-space encoding.

2. The computer implemented method of claim 1, further comprising:

sequentially applying the rephasing gradient after successive refocusing RF pulses and sequentially applying the dephasing gradient prior to successive refocusing RF pulses in the pulse sequence; and acquiring additional spiral ring echo readout data between the rephasing gradients and the dephasing gradients.

3. The computer implemented method of claim 1, further comprising applying a 90 degree tip-up RF pulse after applying the magnitude stabilizer gradient, wherein the 90 degree tip-up RF pulse flips a diffusion-encoded signal back to a respective longitudinal axis.

4. The computer implemented method of claim 1, further comprising applying spoiler gradients to a diffusion encoded signal, along said selected direction, after implementing the diffusion preparation software component.

5. The computer implemented method of claim 1, wherein the image data is acquired in a single shot acquisition.

6. The computer implemented method of claim 1, wherein the image data is acquired in a turbo-spin-echo (TSE) sequence.

7. The computer implemented method of claim 1, wherein implementing the diffusion preparation software component further comprises applying RF pulses, wherein a slice thickness of the RF pulses is larger than that of the refocusing RF pulses applied during signal acquisition.

8. The computer implemented method of claim 7, wherein the slice thickness of the RF pulses applied by the diffusion preparation software component are 1.5 times as large as that for the refocusing RF pulses applied during signal acquisition.

9. The computer implemented method of claim 1, further comprising reconstructing the images of the MRI from the k-space utilizing a non-uniform Fast Fourier Transform (NUFFT).

10. A computerized system for acquiring magnetic resonance imaging (MRI) data, the system comprising:

a computer including a processor and computer memory connected to a magnetic gradient source to implement software program steps in a diffusion preparation software component and a spiral ring echo readout software component, wherein the computer implements a computerized method comprising:

implementing the diffusion preparation software component by:

applying at least a first diffusion gradient and a last diffusion gradient along a selected direction; and applying a magnitude stabilizer gradient, along said selected direction, after the last diffusion gradient;

implementing the spiral ring echo readout software component by:

applying a rephasing gradient along said selected direction after a refocusing RF pulse;

applying a dephasing gradient along said selected direction prior to a subsequent refocusing RF pulse; and acquiring spiral ring echo readout data between the refocusing RF pulse and the subsequent refocusing RF pulse;

storing the spiral ring echo readout data in k-space encoding computing apparent diffusion coefficient (ADC) maps from the spiral ring echo readout data in k-space format.

* * * * *